US009309593B2

(12) United States Patent
Endler et al.

(10) Patent No.: US 9,309,593 B2
(45) Date of Patent: Apr. 12, 2016

(54) HARD-MATERIAL-COATED BODIES COMPOSED OF METAL, CEMENTED HARD MATERIAL, CERMET OR CERAMIC AND PROCESSES FOR PRODUCING SUCH BODIES

(71) Applicant: Fraunhofer-Gesellschaft zur Foerderung der angewandten Forschung e. V., Munich (DE)

(72) Inventors: Ingolf Endler, Coswig (DE); Sebastian Scholz, Dresden (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 30 days.

(21) Appl. No.: 14/360,724

(22) PCT Filed: Nov. 28, 2012

(86) PCT No.: PCT/EP2012/073766
§ 371 (c)(1),
(2) Date: May 27, 2014

(87) PCT Pub. No.: WO2013/083447
PCT Pub. Date: Jun. 13, 2013

(65) Prior Publication Data
US 2014/0370309 A1 Dec. 18, 2014

(30) Foreign Application Priority Data
Dec. 5, 2011 (DE) .......................... 10 2011 087 715

(51) Int. Cl.
*C23C 16/36* (2006.01)
*C23C 16/34* (2006.01)
(Continued)

(52) U.S. Cl.
CPC ............... *C23C 16/34* (2013.01); *C04B 41/009* (2013.01); *C04B 41/4531* (2013.01);
(Continued)

(58) Field of Classification Search
USPC .................... 51/307, 309; 428/697, 698, 699; 427/255, 255.39, 255.391, 255.393, 427/255.394
See application file for complete search history.

(56) References Cited

U.S. PATENT DOCUMENTS 5,182,238 A    1/1993   Holleck
5,981,078 A    11/1999  Tabersky et al.
(Continued)

FOREIGN PATENT DOCUMENTS

DE          38 11 907 C1      8/1989
DE    10 2005 049 393 A1      4/2007
(Continued)

OTHER PUBLICATIONS

Ma et al "Superhard nanocomposite Ti—Si—C—N coatings prepared by pulsed d.c. plasma enhanced CVD" Surface & Tech 200 (2005) p. 382-386.*
(Continued)

Primary Examiner — Archene Turner
(74) Attorney, Agent, or Firm — Collard & Roe, P.C.

(57) ABSTRACT

Hard-material-coated bodies composed of metal, cemented hard material, cermet or ceramic, coated with a TiSiCN composite layer or with a multilayer layer system which contains at least one TiSiCN composite layer. The TiSiCN composite layer is a nanocomposite layer which has been produced by a thermal CVD process without additional plasma excitation and contains a nanocrystalline phase composed of $TiC_xN_{1-x}$ having a crystallite size in the range from 5 nm to 150 nm and a second phase composed of amorphous $SiC_xN_y$. The layer is characterized by a high hardness, a high oxidation and heat resistance and a high adhesive strength.

10 Claims, 2 Drawing Sheets

Figure 1:
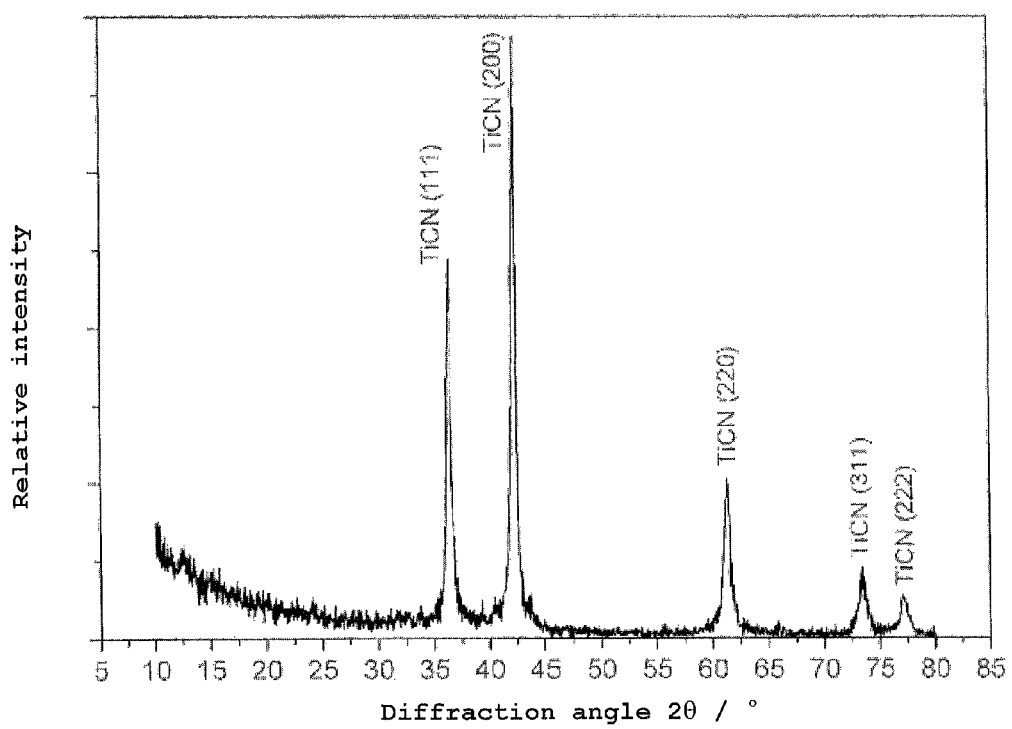

(51) Int. Cl.
    *C04B 41/87*     (2006.01)
    *C04B 41/00*     (2006.01)
    *C04B 41/50*     (2006.01)
    *C23C 28/04*     (2006.01)
    *C04B 41/45*     (2006.01)
    *C04B 41/85*     (2006.01)
    *C23C 16/448*     (2006.01)
    *C04B 111/00*     (2006.01)

(52) U.S. Cl.
    CPC ........ *C04B 41/5062* (2013.01); *C04B 41/5068* (2013.01); *C04B 41/85* (2013.01); *C04B 41/87* (2013.01); *C23C 16/36* (2013.01); *C23C 16/448* (2013.01); *C23C 28/04* (2013.01); *C04B 2111/00405* (2013.01)

(56) References Cited

U.S. PATENT DOCUMENTS

| | | | | |
|---|---|---|---|---|
| 7,527,457 | B2 * | 5/2009 | Moriguchi | C23C 30/005 407/119 |
| 7,553,113 | B2 * | 6/2009 | Omori | B23B 27/141 407/113 |
| 7,592,076 | B2 * | 9/2009 | Flink | C23C 14/0641 428/699 |
| 7,923,130 | B2 * | 4/2011 | Shibata | C23C 14/0641 428/216 |
| 8,012,535 | B2 * | 9/2011 | Sottke | C23C 16/36 427/249.1 |
| 8,247,092 | B2 * | 8/2012 | Hedin | C04B 41/009 428/697 |
| 8,703,245 | B2 * | 4/2014 | Layyous | C23C 30/005 427/255.23 |
| 2008/0026105 | A1 | 1/2008 | Khatib et al. | |
| 2008/0261058 | A1 | 10/2008 | Layyous et al. | |
| 2010/0215951 | A1 | 8/2010 | Shibata et al. | |

FOREIGN PATENT DOCUMENTS

| JP | 09-019806 | * | 1/1997 |
|---|---|---|---|
| JP | 08-118106 | * | 5/1998 |
| JP | 2004-074361 | * | 3/2004 |
| JP | 2004-114219 | * | 4/2004 |
| WO | 97/07260 A1 | | 2/1997 |
| WO | 2008/130316 A1 | | 10/2008 |

OTHER PUBLICATIONS

J.-H. Jeon et al, Synthesis and characterization of quaternary Ti—Si—C—N coatings prepared by a hybrid deposition technique, Surface & Coatings Technology 188-189 (2004) pp. 415-419.

R. Wei et al, Microstructure and tribological performance of nanocomposite Ti—Si—C—N coatings deposited using hexamethyldisilazane precursor, Journal of Vacuum Science and Technology A 28(5), Sep./Oct. 2010 pp. 1126-1132.

D. Ma et al., Microstructure and tribological behaviour of super-hard Ti—Si—C—N nanocomposite coatings deposited by plasma enhanced chemical vapour deposition, Thin Solid Films 496 (2006) pp. 438-444.

P. Jedrzejowski et al., Optical properties and color of hard quaternary nanocomposite TiCxNy/SiCN coatings prepared by plasma enhanced chemical vapor deposition, Surface & Coatings Technology 188-189 (2004) pp. 371-375.

D.-H. Kuo, et al., A new class of Ti—Si—C—N coatings obtained by chemical vapor deposition, Part 1: 1000•C Process, Thin Solid Films 394 (2001) pp. 72-80.

D.-H. Kuo, et al., A new class of Ti—Si—C—N coatings obtained by chemical vapor deposition—Part II: low-temperature process, Thin Solid Films 394 (2001) pp. 81-89.

Ma et al: Synthesis and characterization of super hard, self-lubricating Ti—Si—C—N nanocomposite coatings, ACTA Materialia 55 (2007) pp. 6350-6355.

R. Wei, Plasma enhanced magnetron sputter deposition of Ti—Si—C—N based nanocomposite coatings, Surface and Coatings Technology 203 (2008) pp. 538-544.

D.-H. Kuo, et al., A new class of Ti—Si—C—N coatings obtained by chemical vapor deposition—Part III: 650-800 •C process, Thin Solid Films 419 (2002) pp. 11-17.

International Search Report of PCT/EP2012/073766, mailed Mar. 15, 2013.

Ingolf Endler et al., Ternary and quarternary TiSiN and TiSiCN nancomposite coatings obtained by Chemical Vapor Deposition, Surface & Coatings Technology 215 (2013) pp. 133-140.

\* cited by examiner

HARD-MATERIAL-COATED BODIES COMPOSED OF METAL, CEMENTED HARD MATERIAL, CERMET OR CERAMIC AND PROCESSES FOR PRODUCING SUCH BODIES

CROSS REFERENCE TO RELATED APPLICATIONS

This application is the National Stage of PCT/EP2012/073766 filed on Nov. 28, 2012, which claims priority under 35 U.S.C. §119 of German Application No. 10 2011 087 715.0 filed on Dec. 5, 2011, the disclosure of which is incorporated by reference. The international application under PCT article 21(2) was not published in English.

TECHNICAL FIELD

The invention relates to hard-material-coated bodies of metal, hard metal, cermet or ceramic, coated with a TiSiCN coating or a coating system that contains at least one TiSiCN coating, as well as a process for producing such bodies. The hard-material coating according to the invention, produced on the bodies, is characterized by a high hardness, high oxidation and heat resistance as well as a high adhesive strength, and is usable as a wear-protecting coating on many hard-metal and ceramic tools.

PRIOR ART

Many hard-metal and ceramic tools now have wear-protecting coatings, which decisively influence the useful life. By virtue of their special properties, such as high hardness, good oxidation and heat resistance, for example, the tool is protected and the performance capability is significantly increased.

Thus Ti-based hard-material coatings, such as TiN and TiCN, are known among others. Such hard-material coatings have inadequate oxidation resistance, however, and so, because of the high temperatures at the cutting edge, they cannot be used without cooling lubricant for chip-removing processes.

The oxidation resistance and the hardness of these coatings may be improved by incorporation of further elements such as aluminum or silicon. One approach is the development of silicon-containing nanocomposite coatings, which consist of a nanocrystalline TiCN phase and an amorphous silicon-containing phase.

It is already possible to deposit composites or nanocomposites of the Ti—Si—C—N system with various physical and plasma-enhanced chemical vapor deposition methods. These coatings are characterized by a high hardness and reduced friction values (see J.-H. Jeon, S. R. Choi, W. S. Chung, K. H. Kim, Surface & Coatings Technology 188-189 (2004) 415 and R. Wei, C. Rincon, E. Langa, Journal of Vacuum Science and Technology A 28 (2010) 1126).

In the PVD techniques, magnetron sputtering methods or arc processes are employed, such as described in DE 3811907 C1, WO 2008/130316 A1 and by J.-H. Jean, S.R. Choi, W.S. Chung, K. H. Kim, Surface & Coatings Technology 188-189 (2004) 415. By the use of plasma-enhanced CVD (PECVD), it is also possible to produce TiSiCN coatings with or without nanocomposite structure (see D. Ma, S. Ma, H. Dong, K. Xu, T. Bell, Thin Solid Films 496 (2006) 438 and P. Jedrzejowski, J.E, Klemberg-Sapieha, L. Martinu, Surface & Coatings Technology 188-189 (2004) 371). The TiSiCN nanocomposite coatings produced by means of PECVD have high hardnesses and properties similar to those of the PVD coatings.

Heretofore only a few attempts have been made to produce hard-material coatings in the Ti—Si—C—N system by means of thermal chemical vapor deposition (CVD). Kuo et al. have reported on investigations in this regard in three scientific publications (see D.-H. Kuo, K.-W. Huang, Thin Solid Films 394 (2001) 72 as well as D.-H. Kuo, K.-W. Huang, Thin Solid Films 394 (2001) 81 and D.-H. Kuo, W.-C. Liao, Thin Solid Films 419 (2002) 11). At temperatures up to 800° C., however, they were able to produce only TiSiCN composite coatings with a carbon content lower than 8 atomic %. The crystalline phase was TiN or $TiN_{0.3}$, but not $TiC_xN_{1-x}$. At temperatures between 800° C. and 1100° C., no composite coatings but instead single-phase (Ti,Si)(C,N) coatings with hardnesses between 10 GPa and 27.5 GPa were produced. The hardness of these coatings is therefore comparatively low, in contrast to the above-mentioned super-hard nanocomposite coatings produced by means of PVD and PECVD techniques.

From US 2008/0261058 A1 there is also already known a coating that consists of TiC, TiN or Ti(C,N) and the alloying elements Si, Cr, V. The coating consists either of a crystalline mixed phase with the alloying elements or a composite coating of two or more phases. Therein one phase is present in the form of TiCN grains in the micron range and the other phase consists of nitrides and carbides of the alloying elements Si, Cr, V.

Disadvantages of the disclosed composite coating are that it has only a low hardness and an inadequate oxidation resistance.

DESCRIPTION OF THE INVENTION

The task of the invention is to develop, for bodies of metal, hard metal, cermet or ceramic, a coating system that has one or more layers and that contains at least one TiSiCN hard-material coating, which is characterized by a high hardness, a high oxidation and heat resistance as well as a high adhesive strength. Included in this task is the development of a process that permits a production of such coatings inexpensively even under industrial conditions.

This task is accomplished with the features of the claims, in which connection the invention also includes combinations of the individual dependent claims within the meaning of an AND logic.

The subject matter of the invention are hard-material-coated bodies of metal, hard metal, cermet or ceramic, coated with a TiSiCN composite coating or with a multi-layer coating system that contains at least one TiSiCN composite coating, wherein the TiSiCN composite coating is according to the invention a nanocomposite coating, which is produced by means of a thermal CVD technique without additional plasma excitation and which contains a nanocrystalline phase of $TiC_xN_{1-x}$ with a crystallite size between 5 nm and 150 nm and a second phase of amorphous $SiC_xN_y$.

Therein the nanocrystalline phase of $TiC_xN_{1-x}$ is present in a proportion of 60 mass % to 99 mass %, and the amorphous $SiC_xN_y$ phase in a proportion of 1 mass % to 40 mass %

The composition of the nanocrystalline $TiC_xN_{1-x}$ phase lies in the range of $0.1 \leq x \leq 0.99$, and that of the amorphous $SiC_xN_y$ phase in the range of $0.1 \leq x \leq 0.95$ and $0.05 \leq y \leq 0.9$.

The carbon content of the TiSiCN nanocomposite coating is preferably higher than 8 atomic %.

According to the invention, the TiSiCN nanocomposite coating may contain up to 5 mass % of amorphous carbon as a further component.

According to the invention, the TiSiCN nanocomposite coating according to the invention advantageously has a halogen content of <1 atomic % and an oxygen content of <4 atomic %.

According to the invention, the TiSiCN nanocomposite coating may consist of TiSiCN individual layers with different titanium/silicon ratios and/or have a gradient with respect to the silicon and titanium content.

According to further features of the invention, the TiSiCN nanocomposite coating may be combined in a multi-layer coating system with one or more top coatings and/or coatings that bind to the substrate body, wherein these coatings consist of one or more nitrides, carbides, carbonitrides, oxynitrides, oxycarbides, oxycarbonitrides, oxides of Ti, Hf, Zr, Cr and/or Al or of mixed phases containing these elements.

The composite according to the invention, comprising a nanocrystalline phase of $TiC_xN_{1-x}$ together with an amorphous $SiC_xN_y$ phase and produced by means of thermal CVD, represents a new combination. By virtue of the combination of these two phases, a synergy effect is developed that leads to unexpectedly very good coating properties, namely to a high adhesive strength, to a high oxidation and heat resistance and to a high hardness of up to greater than 4000 HV[0.01].

For the production of the TiSiCN nanocomposite coating according to the invention, the invention includes a process in which the coating is deposited in a gas mixture that contains one or more titanium halides, one or more silicon-containing precursors, hydrogen as well as reactive compounds containing carbon and nitrogen atoms and/or nitrogen compounds and/or hydrocarbons and/or inert noble gases, by means of a thermal CVD process at temperatures between 700° C. and 1100° C. and at pressures between 10 Pa and 101.3 kPa without additional plasma excitation, wherein the mole ratio of the titanium halides and the silicon-containing precursors is selected such that an atomic ratio of Si to Ti greater than 1 exists in the gas mixture.

As the reactive compounds with carbon and nitrogen atoms, it is then advantageously possible to use one or more nitriles, preferably acetonitrile, or amines.

An advantage of the inventive coatings compared with coatings produced by means of PVD is the higher adhesive strength. A further, considerable advantage during use is the incorporation of this coating in more complex, multi-layer CVD coating systems.

Compared with the plasma-enhanced CVD (PECVD) mentioned in the prior art, the thermal CVD process is a simpler process, which is established in industry. PECVD processes do not play any role in tool coating, except for the production of hard carbon coatings. PECVD coatings also do not attain the high adhesive strengths of the coatings produced by means of thermal CVD.

EXAMPLES OF EXECUTION OF THE INVENTION

Figure 2:

The invention will be explained in more detail hereinafter with reference to exemplary embodiments and to the associated drawings, wherein:

FIG. 1: shows the x-ray diffraction diagram of the TiSiCN nanocomposite coating produced by means of CVD in accordance with exemplary embodiment 1, FIG. 2: shows an SEM photograph of the cross section of a coating system comprising two TiN coatings (C) and (B) and the TiSiCN nanocomposite coating (A) in accordance with exemplary embodiment 3.

Example 1

On WC/Co hard-metal indexable inserts precoated with a 5 µm thick TiN/TiCN/TiN coating system, there is deposited a TiSiCN nanocomposite coating as the top coating by means of the thermal CVD process according to the invention.

For this purpose a gas mixture of 4.2 mL/min $TiCl_4$, 20.4 mL/min $SiCl_4$, 7.9 mL/min acetonitrile ($CH_3CN$) and 2400 mL/min hydrogen is passed at 800° C. and 6 kPa into a horizontal hot-wall CVD reactor with an inside diameter of 75 mm for the deposition of the TiSiCN nanocomposite coating.

After a coating time of 120 min, a gray coating, which has a coating thickness of 4.3 µm, is apparent.

In the radiographic thin-film analysis performed at grazing incidence, only the crystalline $TiC_xN_{1-x}$ is found (see x-ray diffraction diagram in FIG. 1). Silicon is contained in a second, amorphous $SiC_xN_y$ phase, by analogy with the XPS analysis performed in Example 3. The mean grain size of the nanocrystalline phase of the $TiC_xN_{1-x}$ was determined to be 19±0.4 nm by means of Rietveld analysis.

Elemental analysis by means of WDX yielded the following elemental contents:
36.86 atomic % Ti,
11.74 atomic % Si,
27.39 atomic % C,
20.82 atomic % N,
0.39 atomic % Cl and
2.80 atomic % O.

A microhardness of 4080 HV[0.01] was measured for this TiSiCN nanocomposite coating.

Example 2

On a WC/Co indexable insert precoated with 1 µm TiN and 3 µm TiCN, there is first applied a further TiN coating with a thickness of 0.5 µm, followed by the TiSiCN nanocomposite coating according to the invention.

For this purpose a gas mixture of 8.3 mL/min $TiCl_4$, 10 mL/min $Si_2Cl_6$, 10.6 mL/min $CH_3CN$ and 2400 mL/min hydrogen is passed at 850° C. and 6 kPa into the CVD reactor mentioned in Example 1. After a coating time of 90 min, a gray coating, which has a coating thickness of 7.6 µm, is obtained.

In the radiographic thin-film analysis performed at grazing incidence, only the crystalline $TiC_xN_{1-x}$ is found, just as in Example 1. Silicon is contained in a second, amorphous $SiC_xN_y$ phase, by analogy with the XPS analysis performed in Example 3. By means of Rietveld analysis, a mean grain size of 39±2 nm was obtained for the nanocrystalline $TiC_xN_{1-x}$ phase.

The WDX analysis yielded the following elemental contents:
41.70 atomic % Ti,
4.30 atomic % Si,
28.07 atomic % C,
23.15 atomic % N,
0.01 atomic % Cl and
2.77 atomic % O.

A microhardness of 3840 HV[0.01] was measured for this TiSiCN nanocomposite coating.

Example 3

On a WC/Co indexable insert precoated with 3 µm TiN, there is first applied a further TiN coating with a thickness of 0.5 µm, followed by the nanocomposite coating of TiSiCN according to the invention.

For this purpose a gas mixture of 4.2 mL/min $TiCl_4$, 10 mL/min $Si_2Cl_6$, 10.6 mL/min $CH_3CN$ and 2400 mL/min hydrogen is passed at 850° C. and 6 kPa into the CVD reactor mentioned in Example 1. After a coating time of 90 min, a gray coating, which has a coating thickness of 3.5 μm, was deposited.

In the radiographic thin-film analysis performed at grazing incidence, only the crystalline $TiC_xN_{1-x}$ is found, just as in Example 1. A crystalline silicon-containing phase is not radiographically detectable. By XPS analysis of the TiSiCN coating, however, Si—N bonds were clearly detected at 101.8 eV and Si—C bonds at 100.7 eV after evaluation of the Si2p spectrum, which bonds indicate the presence of an amorphous $SiC_xN_y$ phase.

The mean grain size of the nanocrystalline phase of the $TiC_xN_{1-x}$ was determined by means of Rietveld analysis, and a value of 12±4 nm was obtained. The nanocomposite structure is evident from the transverse micrograph in FIG. 2. The TiSiCN top coating (A) exhibits a nanocomposite structure, in which paler nanocrystalline $TiC_xN_{1-x}$ crystallites are embedded in a darker amorphous matrix. The microcrystalline binding coatings TiN (C) and (B) can be seen underneath the TiSiCN top coating.

The WDX analysis of the TiSiCN top coating yielded the following elemental contents:
  32.75 atomic % Ti,
  12.72 atomic % Si,
  27.15 atomic % C,
  23.62 atomic % N,
  0.51 atomic % Cl and
  3.25 atomic % O.

A microhardness of 3610 HV[0.01] was measured for this TiSiCN nanocomposite coating.

The invention claimed is:

1. A hard-material-coated body of metal, hard metal, cermet or ceramic, coated with a TiSiCN composite coating or with a multi-layer coating system that contains at least one TiSiCN composite coating, wherein the TiSiCN composite coating is a nanocomposite coating with a halogen content of <1 atomic % and an oxygen content of <4 atomic %, which is produced via a thermal CVD technique without additional plasma excitation and which contains a nanocrystalline phase of $TiC_xN_{1-x}$ with $0.1 \leq x \leq 0.99$ with a crystallite size between 5 nm and 150 nm and a second phase of amorphous $SiC_xN_y$.

2. The hard-material-coated body of metal according to claim 1, wherein the nanocrystalline phase of $TiC_xN_{1-x}$ is present in a proportion of 60 mass % to 99 mass %, and the amorphous $SiC_xN_y$ phase in a proportion of 1 mass % to 40 mass %.

3. The hard-material-coated body of metal according to claim 1, wherein the amorphous $SiC_xN_y$ phase is present with $0.1 \leq x \leq 0.95$ and $0.05 \leq y \leq 0.9$ in the nanocomposite coating.

4. The hard-material-coated body of metal according to claim 1, wherein the carbon content of the TiSiCN composite coating is higher than 8 atomic %.

5. The hard-material-coated body of metal according to claim 1, wherein the TiSiCN nanocomposite coating contains up to 5 mass % of amorphous carbon as a further component.

6. The hard-material-coated body of metal according to claim 1, wherein the TiSiCN nanocomposite coating consists of TiSiCN individual layers with different titanium/silicon ratios.

7. The hard-material-coated body of metal according to claim 1, wherein the TiSiCN nanocomposite coating is combined in a multi-layer coating system with one or more top coatings and/or coatings that bind to the substrate body, wherein these coatings consist of one or more nitrides, carbides, carbonitrides, oxynitrides, oxycarbides, oxycarbonitrides, oxides of Ti, Hf, Zr, Cr and/or Al or of mixed phases with these elements.

8. A process for production of a hard-material-coated body of metal, hard metal, cermet or ceramic, coated with a TiSiCN composite coating or with a multi-layer coating system that contains at least one TiSiCN composite coating, wherein the TiSiCN composite coating is a nanocomposite coating with a halogen content of <1 atomic % and an oxygen content of <4 atomic %, which contains a nanocrystalline phase of $TiC_xN_{1-x}$ with $0.1 \leq x \leq 0.99$ with a crystallite size between 5 nm and 150 nm and a second phase of amorphous $SiC_xN_y$, according to claim 1, wherein the TiSiCN nanocomposite coating is deposited on the body in a gas mixture that contains one or more titanium halides, one or more silicon-containing precursors, hydrogen as well as acetonitrile as a reactive compound containing carbon and nitrogen atoms via a thermal CVD process at temperatures between 700° C. and 1100° C. and at pressures between 10 Pa and 101.3 kPa without additional plasma excitation, wherein the mole ratio of the titanium halides and the silicon-containing precursors is selected such that an atomic ratio of Si to Ti greater than 1 exists in the gas mixture.

9. The process according to claim 8, wherein $N_2$ and/or $NH_3$ are used as the nitrogen compounds and $C_2H_4$ and/or $C_2H_2$ as the hydrocarbons.

10. The process according to claim 8, wherein nitrogen compounds and/or hydrocarbons and/or inert noble gases are additionally admixed with the gas mixture.

* * * * *